United States Patent [19]
Borchert et al.
[11] 3,919,009
[45] Nov. 11, 1975

[54] METHOD FOR PRODUCING AN IMPROVED THYRISTOR

[75] Inventors: Edgar Borchert; Karlheinz Sommer, both of Belecke, Germany

[73] Assignee: Licentia Patent-Verwaltungs-G.m.b.H., Frankfurt, Germany

[22] Filed: Mar. 4, 1974

[21] Appl. No.: 448,041

[30] Foreign Application Priority Data

Mar. 2, 1973 Germany ........ 2310570

[52] U.S. Cl. ........ 148/189; 148/187; 148/33.5; 357/39

[51] Int. Cl.$^{2}$ ........ H01L 7/44

[58] Field of Search ........ 148/189, 187, 33.5; 357/39

[56] References Cited

UNITED STATES PATENTS 2,954,308 9/1960 Lyons ........ 148/189 X
3,078,196 2/1963 Ross ........ 148/33.5
3,345,221 10/1967 Lesk ........ 148/33.5 X
3,461,359 8/1969 Raithel et al. ........ 148/188 X

*Primary Examiner*—G. Ozaki
*Attorney, Agent, or Firm*—Spencer & Kaye

[57] ABSTRACT

A method for producing a thyristor wherein after the semiconductor body has been doped in the conventional manner to produce the usual layers of alternating conductivity type, the net doping of the high resistivity base zone of the thyristor is increased in a locally limited region below the portion of the surface of the semiconductor body to which the control electrode is to be attached. The increased net doping is achieved by diffusing elements which form doping impurities into the semiconductor body in a controlled manner from the cathode side of the thyristor. The result of the increased net doping is that the pn-junction of the thyristor which changes from the blocking to the conductive state upon firing of the thyristor breaks down initially beneath the control electrode when the forward breakover voltage is exceeded.

15 Claims, 11 Drawing Figures

METHOD FOR PRODUCING AN IMPROVED THYRISTOR

BACKGROUND OF THE INVENTION

The present invention relates to a method for producing an overhead-firing stable thyristor, i.e., a thyristor which can be anode-triggered by exceeding the forward breakover voltage without being damaged.

Controllable semiconductor devices, such as thyristors or triacs (bidirectional triode thyristors) are known to be made conductive by firing. A thyristor initially blocks in both directions. A current pulse delivered into the control electrode fires the thyristor thus causing it to become conductive in the forward direction. To effect this conduction in the forward direction the control current must not fall below a certain minimum value, the firing current.

It is possible, however, for a thyristor to also fire in the forward direction when a certain voltage, the so-called forward breakover voltage, is exceeded without a control pulse being present. During normal operation, this firing without a control pulse should be avoided if possible because of its disadvantageous consequences for the thyristor which might lead to its destruction. Thus the values given for the permissible positive and negative periodic peak blocking voltage generally lie at an appropriate distance from the forward breakover voltage.

This generally undesirable firing process is also called "overhead firing." It is initiated by the low blocking current of the pn-junction, the area of the fired region being small. The device is particularly endangered in this state in circuits having a high rate of change of current, i.e., high di/dt values, because the device may be destroyed by thermal overload in the narrow firing channel.

Since this undesirable firing takes place at an arbitrary and unpredictable portion of the thyristor wafer, the process cannot be influenced by structural measures. For this reason it is generally not possible to use the available structures for amplifying the firing process, which structures become effective during the normal firing process by applying a current pulse to the gate contact, to eliminate this danger of overhead firing. Rather, the prior art has been limited to complicated measures for preventing such overhead firing, for example, a special protective circuit, generally an RC circuit.

Additionally, it has been proposed to make a thyristor overhead firing stable by suitably doping the high resistivity base, e.g., the $s_n$ base, by utilizing semiconductor wafers, possibly silicon wafers, having a special doping profile in the radial direction as the semiconductor bodies. It has been attempted to produce crystals having a greater net doping in their nucleus by suitably adjusting the growth conditions during the floating zone process. For this purpose the resistivity must have a cup-shaped profile and this profile must have a defined height and shape. The production of such crystals, however, has been found to be so difficult that only very few specimens in a lot met all the requirements and a time consuming selection and test procedure for the silicon wafers could not be avoided.

SUMMARY OF THE INVENTION

It is the object of the present invention to provide a method for producing overhead-firing stable thyristors which, without the above-mentioned additional circuit measures and without the previously required difficult processes for producing a certain doping profile, will not be endangered of being destroyed by localized thermal overload when firing results due to exceeding the forward breakover voltage.

This is accomplished according to the present invention in that in a process for producing a thyristor the semiconductor body is initially doped to produce the intended layers of varying conductivity type in the usual manner and then the net doping of the high resistivity base zone in a locally defined area below the gate firing arrangement is increased by a subsequent controlled introduction from the cathode side of elements which form doping impurities, so that the pn-junction which upon firing of the thyristor changes from the blocking to the conductive state will break through first below the firing arrangement or control electrode when the forward breakover voltage is exceeded.

The method of the present invention has the result that the breakthrough will take place exactly at the point inside the device below the firing arrangement or control electrode where it is intended to take place and not at any arbitrary and unpredictable point, particularly at the edge zones of the junctions.

When the high resistivity base zone is a region with n-type conductivity, it is advantageous to effect the subsequent setting of the higher net doping by a diffusion of an element of the VIth main group of the Periodic Table of Elements except for oxygen, and preferably sulfur, which permits the level of donor concentration in the $s_n$ base zone to be easily brought to twice its original value. The net doping can thus be easily adapted to the intended forward breakover voltage. Limiting the net doping to a spatially defined area in this procedure is realized by using the conventional diffusion masking technique so that it will be possible to produce various structures — even complicated firing arrangements, such as for example distributed gate structures, if required — within relatively close tolerances.

The utilization of sulfur, which has a high diffusion speed in a semiconductor body, for the subsequent diffusion operation enables diffusion times and temperatures to be employed with which the already available structure and the already available arrangement of the layers of varying conductivity types will not be noticeably changed in their position. On the other hand, the poor solubility of sulfur in the semiconductor material results in only small quantities of sulfur remaining in the traversed outer layers as a residue during and after the diffusion so that the higher doping of these regions will no longer be noticeably changed. Since, for example, the solubility of sulfur is less by several orders of magnitude than, for example, that of gallium or phosphorus, sulfur doping will no longer have any annoying influence in layers which are highly doped with gallium or phosphorus.

DESCRIPTION OF THE PREFERRED EMBODIMENTS

Figure 1:
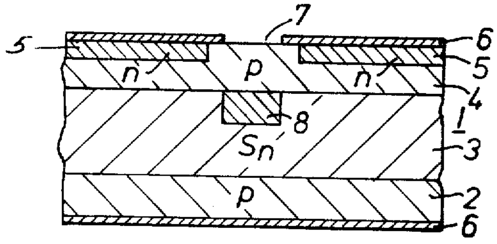
FIG. 1 is a cross-sectional view of a thyristor produced according to one embodiment of the method of the present invention.

Referring now to FIG. 1, there is shown a semiconductor wafer 1 which has been suitably doped to provide a thyristor structure including layers 2, 3, 4, 5 of alternating conductivity type and in particular a layer sequence of $p$, $s_n$, $p$ and n-type conductivity, respectively. This layer sequence is produced, for example, by using weakly doped n-type ($s_n$) silicon as the starting material and then producing the remaining layers 2, 4 and 5 by means of the conventional gallium and phosphorus diffusions and the oxide masking technique.

On the thus prepared semiconductor wafer which already exhibits the total completed thyristor structure, an oxide layer 6 is again produced on both major surfaces of the wafer or body 1. Openings 7 which correspond in position, shape and size to the gate firing arrangement of the thyristor are provided in the oxide layer 6 on the cathode side of the wafer. The thus masked wafer 1 is then subjected to a sulfur diffusion whereby the sulfur penetrates into the wafer through the portions which are not covered by the oxide layer 6 and increases the donor concentration in region 8 of the $s_n$, i.e., high resistivity, base zone 3 to such an extent that it will have 1.3 to 2 times the value of the donor concentration in the remainder of the $s_n$ base zone. The magnitude of the donor concentration depends on the value of the intended forward breakover voltage.

Figure 2:
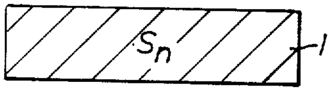
FIGS. 2–7 illustrate the various steps of the method of the invention to produce the device of FIG. 1.
Figure 3:
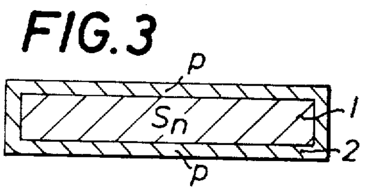
Figure 4:
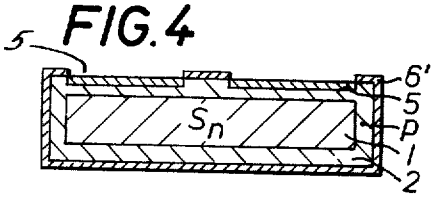

For a semiconductor device with a central control gate contact there then result approximately the following process steps shown in FIGS. 2 to 7. A starting wafer 1, for example, a silicon wafer of n-type conductivity as shown in FIG. 2, receives — as shown in FIG. 3 — a change in doping to p-type conductivity in the outer zones 2 by means of doping the wafer with gallium. The semiconductor wafer 1 is then covered with an oxide layer 6′ as shown in FIG. 4 and phosphorus is diffused through openings in this layer so that regions 5 of n-type conductivity are produced.

Figure 5:
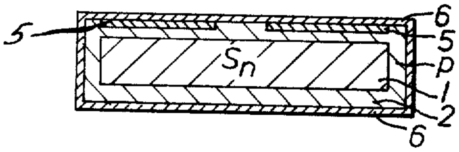
Figure 6:
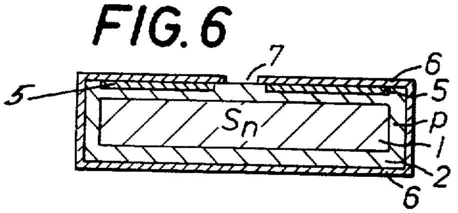
Figure 7:
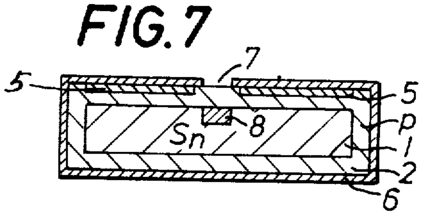

As shown in FIG. 5 the resulting thyristor structure is again provided with an oxide layer 6 which, as shown in FIG. 6, is provided with an opening 7 above the locus of the firing arrangement or control electrode to form the diffusion for the subsequent sulfur diffusion and consequently the production of the higher doped region 8 of FIG. 7.

The embodiment shown in FIGS. 2 to 7 is advantageous for thyristors having a transverse field emitter and a central control contact. With other firing arrangements in a thyristor, for example, an amplifying gate ring-type embodiments which are adapted to the geometry of the firing arrangements, are more advantageous. The individual process steps for such an embodiment are shown in FIGS. 8 through 11; the reference numerals correspond to those employed in FIGS. 1 through 7.

Figure 8:
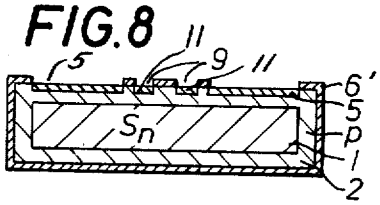
FIGS. 8–11 illustrate the various steps of a modified embodiment of the method of the invention.
Figure 9:
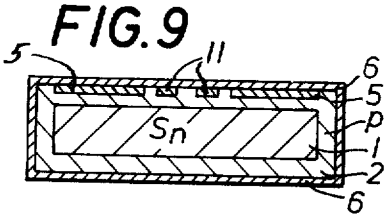
Figure 10:
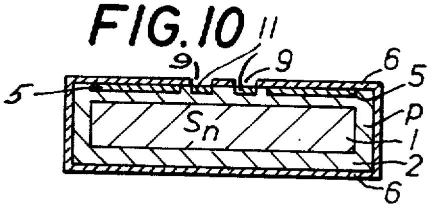
Figure 11:
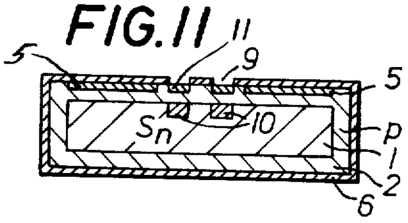

FIG. 8 shows a thyristor with an amplifying gate structure after the phosphorus doping which produces the region 5 and the annular auxiliary emitter 11 via annular opening 9′ in the oxide layer 6′ while FIG. 9 shows the device after its surface is again completely covered with an oxide layer 6. This oxide layer 6 is then provided with an annular opening 9 above the annular auxiliary emitter 11 as shown in FIG. 10. During the subsequent sulfur diffusion, the annular higher doped zone 10 is produced within the $s_n$ base 1 and underneath the auxiliary emitter 11 as shown in FIG. 11.

The selection of the diffusion conditions for the sulfur diffusion, particularly the temperature, duration and the selection of the doping material, permits accurate setting of the magnitude of the net doping in the firing arrangement region and thus of the level of the forward breakover voltage for the thyristor. It has been found advisable for the sulfur diffusion to have the wafers placed into a quartz ampul filled with argon. The pressure of the argon should be about 200 Torr when the filling takes place at room temperature so that, at the diffusion temperature, the internal pressure of the ampul corresponds approximately to the level of the external pressure.

As a source of doping material a quartz vessel with elementary sulfur having a purity of about 99.999% is disposed in the ampul. The quantity of the sulfur is selected so that at the diffusion temperature a partial sulfur pressure of about 10 Torr will develop. This value corresponds to approximately 1.2 mg sulfur per 150 $cm^3$ ampul volume.

The diffusion of the sulfur then takes place at the relatively low temperature of about 1000°C and in a known manner for a duration of about 6 to 30 hours. The exact diffusion conditions are adapted to the thickness of the semiconductor wafers and the desired donor concentration and are selected accordingly, the duration of the diffusion depending in particular on the depth of the pn-junction.

Thyristors which are overhead-firing stable and which are produced according to the method of the present invention offer a particular advantage in series connections because different firing delay times of the individual devices will no longer lead to overload conditions and thus to the possible malfunction of other devices in the series. According to a second example of another element of Group VI of the Periodic Table which can be used, selenium is diffused into the semiconductor wafer at the temperature of about 1,250°C in a known manner for a duration of about 1 to 3 hours. The quantity of selenium is so dimensioned that at the diffusion temperature a partial selenium selenium pressure of about 10–40 Torr will develop. This value corresponds to approximately 1–5 mg selenium per 150 $cm^3$ ampul volume.

It will be understood that the above description of the present invention is susceptible to various modifications, changes and adaptations, and the same are intended to be comprehended within the meaning and range of equivalents of the appended claims.

We claim:

1. In a method of producing a controllable thyristor including initially doping a semiconductor body to produce the usual layers of alternating conductivity type required to produce a thyristor; the improvement comprising, thereafter increasing the net doping of the high resistivity base zone of the thyristor in a locally limited region below the portion of the surface of the semiconductor body to which the control electrode is to be attached by diffusing elements which form doping impurities into the semiconductor body in a controlled manner from the cathode side of the thyristor, whereby the pn-junction of the thyristor which changes from the blocking to the conductive state upon firing of the thyristor breaks through initially beneath the control electrode when the forward breakover voltage is exceeded.

2. A method as defined in claim 1 wherein said step of increasing the net doping of the high resistivity base zone of the thyristor in a locally limited region includes diffusing a doping substance which is soluble in the semiconductor material of the semiconductor body only in a small quantity and which diffuses in the semiconductor material at high speed relative to the doping substances already present in the semiconductor body into the semiconductor body from the cathode side of the device.

3. A method as defined in claim 2 wherein the doping substance employed is an element of the VIth Main Group of the Periodic Table of Elements other than oxygen.

4. A method as defined in claim 3 wherein the doping substance is sulfur.

5. A method as defined in claim 3 wherein said step of increasing the net doping of the high resistivity base zone of the thyristor in a locally limited region further includes forming a diffusion mask, which has an opening corresponding to the desired locally limited region, on the surface of said semiconductor body prior to the diffusion of said doping substance into the semiconductor body.

6. A method as defined in claim 5 wherein the mask is an oxide mask.

7. A method as defined in claim 3 further including placing the semiconductor body in a quartz ampul prior to said step of diffusing, and carrying out said step of diffusing in said quartz ampul.

8. A method as defined in claim 7 including filling the quartz ampul with an protective argon gas atmosphere prior to said step of diffusing.

9. A method as defined in claim 8 wherein said step of filling includes placing the protective argon gas under a sufficient pressure so that the internal pressure of the ampul at the diffusion temperature is approximately equal to the outside pressure.

10. A method as defined in claim 9 wherein the doping substance is sulfur and wherein the diffusion is carried out at a temperature of approximately 1,000°C.

11. A method as defined in claim 10 wherein the diffusion of sulfur takes place for approximately 6 to 30 hours.

12. A method as defined in claim 1 wherein thyristors are produced which have a central gate, and said locally limited region is centrally located in the high resistivity base zone.

13. A method as defined in claim 1 wherein thyristors are produced which have a transverse field emitter.

14. A method as defined in claim 1 wherein thyristors are produced which have an amplifying gate structure including an auxiliary emitter region, and said locally limited region is below said auxiliary emitter region.

15. A method as defined in claim 14 wherein said step of increasing the net doping includes forming a diffusion mask on the cathode side of the semiconductor body, said mask having an opening corresponding to the location of the auxiliary emitter region, and diffusing an element of the VIth Main Group of the Periodic Table of Elements other than oxygen, into the semiconductor body.

* * * * *